United States Patent [19]

Shinozaki et al.

[11] Patent Number: 4,766,053
[45] Date of Patent: Aug. 23, 1988

[54] METHOD FOR FORMING AN IMAGE

[75] Inventors: Fumiaki Shinozaki; Tomizo Namiki; Kazuo Suzuki, all of Shizuoka, Japan

[73] Assignee: Fuji Photo Film Co., Ltd., Kangawa, Japan

[21] Appl. No.: 830,816

[22] Filed: Feb. 19, 1986

[30] Foreign Application Priority Data

Feb. 19, 1985 [JP] Japan .................................. 60-31238

[51] Int. Cl.$^4$ ................................................ G03C 1/90
[52] U.S. Cl. .................................... 430/256; 430/257; 430/258; 430/262; 430/263
[58] Field of Search ............... 430/256, 257, 258, 262, 430/263

[56] References Cited

U.S. PATENT DOCUMENTS

| | | | |
|---|---|---|---|
| 2,385,599 | 9/1945 | Ball et al. | 430/257 |
| 3,721,557 | 3/1973 | Inoue et al. | 430/257 |
| 4,304,836 | 12/1981 | Cheema et al. | 430/257 |
| 4,482,625 | 11/1984 | Namiki et al. | 430/257 |
| 4,596,757 | 6/1986 | Barton et al. | 430/262 |

*Primary Examiner*—Richard C. Schilling
*Attorney, Agent, or Firm*—Sughrue, Mion, Zinn, Macpeak & Seas

[57] ABSTRACT

A method is described for forming an image by transferring an image layer formed on a transferable light-sensitive material to an image-receiving sheet, and then further transferring the image to a permanent support, wherein the image-receiving sheet comprises a support, a first layer on the support, said first layer being made of a first organic polymeric substance, and a second layer on the first layer, said second layer being made of a second organic polymeric substance, wherein in peeling apart the image-receiving sheet from the transferable light-sensitive material, $P_1, P_2, P_3 > P_4$ wherein $P_1$ is an adhesion force between the support and the first layer, $P_2$ is an adhesion force between the first and second layers, $P_3$ is an adhesion force between the second layer and the image layer, and $P_4$ is an adhesion force between the transferable image layer and the support of the image, and in re-transferring the image layer to the permanent support and peeling apart the image-receiving sheet from the permanent support, $P_5, P_1, P_2 > P_3$, or $P_5, P_1, P_3 > P_2$ wherein $P_5$ is an adhesion force between the permanent support and the transferable image layer.

9 Claims, No Drawings

METHOD FOR FORMING AN IMAGE

BACKGROUND OF THE INVENTION

The present invention relates mainly to a method for forming image using a transferring material for use as a color proof or display for color correction.

A method comprising exposing a light-sensitive laminate comprising a temporary support, and a peelable layer made of an organic polymer and a light-sensitive resin layer provided on the support, developing the laminate to form an image on the peelable layer, and then transferring the image onto a suitable support is known, as described, for example, in Japanese Patent Publication Nos. 15326/71 and 441/74 corresponding to U.S. Pat. No. 3,721,557. This method can be used in the overlay type or surprint type as a color proof, but has disadvantages in that the process is complicated because it is necessary to use an adhesive for each transfer, and accurate positioning in transferring each color is difficult.

To avoid the complexity of such a method, a method transferring an image onto an image-receiving sheet by application of heat and pressure after forming the image has been developed as described in Japanese Patent Application (OPI) Nos. 41830/72, 93337/83, and 5101/76 corresponding to U.S. Pat. No. 4,304,836 (the term "OPI" as used herein means a "published unexamined Japanese patent application"). Japanese Patent Application (OPI) No. 5101/76 discloses a method in which a heat meltable polymer layer is provided on a permanent support as an adhesive, and Japanese Patent Application (OPI) No. 41830/72 discloses a method in which an image is transferred directly to a permanent support such as art paper or coated paper.

These methods, however, have the following disadvantages. One of the disadvantages is that the final image is a virtual image of the original. Another disadvantage is that when a heat meltable polymer is used which melting point is generally high, high transferring temperature is necessarily applied. By the heat dimensional stability of the support is degraded, and deviations in positioning during transferring of each color increase. Still another advantage is that in a case of using a polymer having a low melting point when some of final products are piled, adhesion between surfaces of the final product or a surface thereof and a surface of a permanent support of the final product readily occurs, or scratches are readily formed after images are obtained.

A method for overcoming the above problems is described in Japanese Patent Application (OPI) No. 97410/84 corresponding to U.S. Pat. No. 4,482,625. In accordance with this method, before transferring an image of each color on a permanent support, the image of each color is first transferred to a temporary image-receiving sheet with a photopolymerizable receiving layer, and then the image is again transferred to a permanent support and the photopolymerizable image-receiving layer is solidified by light exposing the whole surface.

This method is very effective in overcoming the above problems. In accordance with this method, a positive image in relation to the mask original can be obtained, the photopolymerizable image-receiving layer itself is soft because it contains a polyfunctional ethylenical monomer, and although transferring can be carried out at a low temperature, the adhesion is good and scratch resistance is good because the photopolymerizable image-receiving layer is solidified by exposure to light.

The above method, however, has the following disadvantages: (1) the process is complicated because a post-exposure step is needed, (2) when the support of the photopolymerizable image-receiving layer is smooth, the surface of an image transferred to the final support possesses luster, and, therefore, in order to produce an image having similarity to a printed matter, it is necessary for the surface to be roughened using, for example, a mat film, as a result of which the process is made complicated, and (3) if an initiator, for example, in the photopolymerizable image-receiving layer is colored even to a small extent, the whiteness of the paper is reduced.

The present invention is intended to overcome the above problems (1) to (3).

That is, the objects of the present invention is to obtain an image which is increased in similarity to a printed matter as a result of obtaining unevenness of paper and further increased in the whiteness of nonimage areas without steps of post-exposure and matting but only by peeling after the transferred image which is obtained by transferring the transferrable image to an image-receiving sheet is transferred to a permanent support such as paper, a metallic plate, a plastic film and cloth.

SUMMARY OF THE INVENTION

The present invention relates to a method for forming an image by transferring an image layer formed on a transferable light-sensitive material to an image-receiving sheet, and then further transferring the image to a permanent support, which is characterized in that the image-receiving sheet comprises a support, a first layer on the support, said first layer being made of a first organic polymeric substance, and a second layer on the first layer, said second layer being made of a second organic polymeric substance, wherein in peeling apart the image-receiving sheet from the transferable light-sensitive material, $$P_1, P_2, P_3 > P_4$$

wherein $P_1$ is an adhesion force between the support and the first layer, $P_2$ is an adhesion force between the first and second layers, $P_3$ is an adhesion force between the second layer and the image layer, and $P_4$ is an adhesion force between the transferable image layer and the support for the image layer and in retransferring the image layer to the permanent support and peeling apart the image-receiving sheet from the permanent support, $$P_5, P_1, P_2 > P_3, \text{ or}$$

$$P_5, P_1, P_3 > P_2$$

wherein $P_5$ is an adhesion force between the permanent support and the transferable image layer.

DETAILED DESCRIPTION OF THE INVENTION

A support for the image-receiving sheet should be made of a substance which is chemically and thermally stable, and is flexible. In particular, thin sheets of, e.g., polyethylene terephthalate and polycarbonate are preferred. In some cases, for example, paper laminated with a polyethylene film can be used. In order to increase $P_1$ as defined above, the support can be subjected to surface treatment such as corona discharge treatment, glow-discharge treatment, surface matting, and irradiation with ultraviolet rays, or can be provided with an undercoat layer.

A support for the transferable light-sensitive material includes preferably polyetheleneterephthalate film, acetate film, polyvinylchloride film, polystyrene film, polypropylene film, polycarbonate film, etc.

The softening point of the first layer is preferably from 80° C. to −100° C.

The organic polymeric substance for use in preparation of the first layer is preferably selected from organic polymeric substances having a softening point of not more than about 80° C. (as determined by the Vicat method, specifically the polymer softening point-measuring method as defined in ASTM D1235). The reason for this is as follows. In the case that a polymer having a low softening point is used, when a transferable image is transferred to an image-receiving sheet and then further transferred to a permanent support such as paper by application of heat and pressure, the layer is embedded complying with unevenness of the paper, thereby improving close contact with the paper, and moreover, increasing similarity with a printed matter without matting the surface of the transferred image on the paper. On the other hand, when a polymer having a high softening point is used, it is necessary to carry out the transferring at a high temperature and, therefore, the properties, e.g., dimensional stability of the image are adversely influenced. For this reason, when a polyethylene terephthalate film, for example, is used as a support for a light-sensitive material or image-receiving material, the softening point as determined by the Vicat method of the organic polymeric substance is not more than about 80° C., preferably not more than 60° C., and especially preferably not more than 50° C. The lowest limitation of the softening point thereof is −100° C.

Representative examples of the organic polymeric substance having a softening point of not more than about 80° C. include: polyolefins such as polyethylene and polypropylene; ethylene copolymers such as an ethylene-vinyl acetate copolymer, ethylene-ethylacrylate and an ethylene-acrylate copolymer; polyvinyl chloride; vinyl chloride copolymers such as a vinyl chloride-vinyl acetate copolymer; polyvinylidene chloride; vinylidene chloride copolymer; polystyrene, styrene copolymers such as a styrene-acrylate, methacrylate or hexylacrylate copolymer, styrene-butadiene copolymer; polyvinyl toluene; vinyl-toluene copolymers such as a vinyltolueneacrylate or methacrylate copolymer; polyacrylate or polymethacrylate; acrylate or methacrylate copolymers such as a butyl acrylate or methacrylate-vinyl acetate copolymer; vinyl acetate copolymers; polyamide resins such as nylon, nylon copolymers, alcohol-soluble polyamide and N-alkoxymethylated nylon; synthetic rubber; and chlorinated rubber.

In addition, organic polymeric substances having a softening point of not more than about 80° C., as described in *Plastic Seino Binran* (*Plastic Performance Handbook*), edited by the Japanese Plastic Industry Association and the Japanese Plastic Molding Industry Association, published by Industrial Search Co., Oct. 25, 1968, can be used.

To these organic polymeric substances can be added various plasticizers compatible therewith, in order to substantially lower the softening point thereof. Even in the case of organic polymeric substances having a softening point of more than 80° C., their softening points can be substantially decreased to less than 80° C. by adding plasticizers compatible therewith. The preferable plasticizers are described, for example, in Japanese Patent Application (OPI) No. 12543/85.

Typical examples of a plasticizer include phthalic esters, such as dimethyl phthalate, diethyl phthalate, dibutyl phthalate, diisobutyl phthalate, dioctyl phthalate, octylcapryl phthalate, dicyclohexyl phthalate, ditridecyl phthalate, butyl benzyl phthalate, diisodecyl phthalate, diaryl phthalate, etc.; glycol esters, such as dimethyl glycol phthalate, ethylphthalyl ethylglycolate, methyl phthalyl ethylglycolate, butylphthalyl butylglycolate, triethylene glycol dicaprylic ester, etc.; phosphoric esters, such as tricresyl phosphate, triphenyl phosphate, etc.; esters of dibasic fatty acids, such as diisobutyl adipate, dioctyl adipate, dimethyl sebacate, dibutyl sebacate, dioctyl sebacate, dibutyl maleate, etc.; amides, such as benzenesulfonamide, p-toluenesulfonamide, N-n-butylacetamide, etc.; triethyl citrate, glycerin triacetyl ester; and butyl laurate.

In order to control the adhesion between the support of the image-receiving sheet and the second organic polymeric substance on the support, various polymers, super-cooling substances, adhesion-promoting agents, surfactants, and releasing agents can be added as long as the softening point of the first layer substantially does not exceed 80° C. For example, when a vinyl acetate-ethylene copolymer is used as the first layer on the polyethylene terephthalate film, it is particularly effective to add a small amount, e.g., of chlorinated polyethylene.

The thickness of the first layer of the organic polymeric substance is preferably from 1 to 50 μm, and particularly preferably from 5 to 30 μm. One of the reasons for this is that when an image transferred to the image-receiving sheet is transferred to the permanent support, it is necessary for the thickness of the first organic polymeric substance layer to be made larger than the depth in unevenness in the surface of the permanent support. Another reason is that in a case that there are irregularities in image and non-image areas of the transferable image when the transferable image is transferred to the image-receiving sheet, the thickness of the first layer may be small in the case of mono-color, but when four colors, for example, for a color proof are overlapped, the thickness of the first layer is preferably four times that of irregularities in image and non-image areas of each color.

The adhesion forces of $P_1$ to $P_5$ are precisely measured according to a method of measuring peeling force using, for example, Tensilon UTM-II-20 tensile strength tester (made by Toyo Borldwin Co., Ltd.), but, practically, the adhesion force is compared and evaluated by observing peeled surfaces of layers when the layers are peeled off with a definite force.

The reasons why the second organic polymeric substance is provided on the first organic polymeric substance having a softening point (as determined by the Vicat method) of substantially not more than about 80° C. are as follows. One of the reasons is to eliminate the problems that the organic polymeric substance is sticky and difficult to handle because its softening point is low, and to prevent the phenomenon of paper-peeling occurrence if there are areas where the first layer comes into contact with the final support when a transferable image is transferred to an image-receiving material and then further transferred to a permanent support such as paper, as a result of too strong adhesion. Another reason is to extend the latitude of image formation. In order to attain the object of the present invention, after a transferable image is transferred to the image-receiving material by application of heat and pressure, when the image-receiving material is peeled apart from the transferable light-sensitive material, it is preferred that the adhesion force between the support of the image-receiving material and the organic polymeric substance, S1, and the adhesion force between the organic polymeric substance layer and the image, S2, are greater than the adhesion force between the transferable image and the support of the transferable image layer. Furthermore in a case that the image is transferred to the image-receiving material and then retransferred to the permanent support by application of heat and pressure, when the image-receiving material is peeled apart from the permanent support, it is preferred that the adhesion force between the permanent support and the transferable image, S4, is greater than the above S1 and S2.

As the organic polymeric substance to be used in the second layer, various substances can be used. The organic polymeric substance to be used in the second layer should be determined appropriately depending on the method of forming a transferable image, the material of image-forming areas, or the material of the permanent support (e.g., synthetic paper, art paper, coat paper, wood-free paper, rough paper, Al plate, Cu plate, Fe plate, stainless steel plate, tin plate, galvanized sheet steel, synthetic film, cloth, or fabric of cotton, polyester, Nylon, etc, and material for production of cans). As the method of forming a transferable image, various image-forming methods as described above can be employed.

Representative examples of the organic polymeric substance to be used in the second layer are polyolefins such as polyethylene and polypropylene, ethylene copolymers such as an ethylene-vinyl acetate copolymer, an ethylene-acrylate copolymer and an ethylene-acrylic acid copolymer, polyvinyl chloride, vinyl chloride copolymers such as a vinyl chloride-vinyl acetate copolymer, polyvinylidene chloride, vinylidene chloride copolymers, polystyrene, styrene copolymers such as a styrene-maleate copolymer, polyacrylate, acrylate copolymers such as an acrylate-vinyl acetate copolymer, polymethacrylate, methacrylic acid copolymers such as an alkyl methacrylate-vinyl acetate copolymer, vinyl acetate copolymers, a butyral resin, gelatin, modified polyvinyl alcohol, such as polyvinyl butyral, polyamide resins such as nylon, alcohol-soluble polyamide or copolymer nylon, synthetic rubber, chlorinated rubber, and cellulose derivatives. These compounds can be used alone or in combination with each other.

Any substances can be used in the second layer as long as the organic polymeric substance used in the first layer and the organic polymeric substance as used in the second layer satisfy the above described relation of adhesion forces. Preferably substances having a higher softening point than that of the first layer are used. Preferably, the second layer has a higher softening point than the first layer, by 10° C. of more, more preferably by 20° C. or more and the upper limit of the softening point thereof is about 150° C. In order to satisfy the adhesion force relation of the present invention, other additives such as an adhesion-promoting agent, a releasing agent and further other additives such as a surface active agent, a plasticizer, and a supercooling substance can, of course, be used. In the further transferring, peeling is conducted between the second layer and image areas, or the first layer and the second layer. For this choice, not only is the selection of the material of the organic polymeric substance important, but so also is the addition of a fluorine- or silicone-based releasing agent and adhesion-promoting agent in order to improve the results obtained. Typical examples of the adhesion-promoting agent include a silane adhesion-promoting agent, such as γ-methacryloxypropyltrimethoxy silane, γ-glycidoxypropyltrimethoxy silane, N-β-(aminoethyl)-γ-aminopropyltrimethoxy silane, etc. and on organic titanium adhesion-promoting agent, such as tetraisopropyl titanate tetrabutyltitanate, tetrabutyltithanate polymer, isopropoxytitanium stearate, etc.

The thickness of the second layer is preferably from 0.1 to 10 μm and more preferably from 0.5 to 3 μm. When an organic polymeric substance having a softening point higher than the transferring temperature is used in the second layer, if the thickness is too large, it is not embedded in irregularities in the surface of the permanent support, and thus the close contact is reduced or similarity to printed matter is reduced. In the case that the image-receiving material is peeled apart from the permanent support by thermal transferring, if the second layer is peeled apart from the image areas, the influences effected by the thickness of the second layer of the organic polymeric substance are limited. However, when the first and second layers are peeled apart from each other, if the thickness is too large, luster is formed, thereby deteriorating the similarity to printed matter because the second layer is present on the image areas of the permanent support. This method, however, may be used when a feeling of high quality is required as is required in the display.

In the composition and the method of forming a transferable image layer according to the present invention, various method steps and various materials as described in the above-described patents can be used. Particularly preferred is a material comprising a support, a peelable layer on the support, and a coloring matter-forming layer of a light-sensitive resin on the peeling layer. If such a peeling layer is not provided, the image areas themselves should be heat transferred to the permanent support. This, however, produces limitations that the range of choices for the material is narrowed, and the temperature for heat transferring is increased. If the peelable layer is provided, a peeling function is obtained and, therefore, advantages are produced, in that the latitude of temperature is broadened or the type of the material to be transferred to the permanent support is widely selected broadened. This peelable layer may be such that in formation of a photographic image, the peelable layer on non-image areas is etched at the time of development, thereby remaining unremoved only below the image areas, or the peelable layer is not etched at the time of development and a color image is formed on the peelable layer. In the latter case, the adhesion force between the second organic polymeric substance and the image, $P_3$, is an adhesion force between the second organic polymeric substance and both the peelable layer on nonimage areas and the coloring matter-forming layer on image areas. The adhesion force between the transferable image and the support bearing the image, $P_4$, is the adhesion force between the peelable layer and the support bearing a transferable image. The adhesion force between the transferable image and the permanent support, $P_5$, is an adhesion force between the peelable layer and the permanent support. In case that four color transferring is applied onto the image-receiving material for the purpose of color correction such as a color proof, it is necessary that not only $P_1$, $P_2$, and $P_3$ but also the adhesion force between layers for each color be greater than $P_4$.

In the former case, the adhesion force between the second organic polymeric substance and the image, $P_3$, is an adhesion force between the second organic polymeric substance and the coloring matter-forming layer on image areas, and the adhesion force between the transferable image and the support with the transferable image, $P_4$, is an adhesion force includes both an adhesion force between the peelable layer and the support with the transferable image and an adhesion force between the second organic polymeric substance and the support with the transferable image. The adhesion force with the transferable permanent support, $P_5$, means an adhesion force between the peelable layer on image areas and the permanent support, or an adhesion force between the peelable layer and the permanent support and an adhesion force between the organic polymeric substance in the second layer and the permanent support. The former case is suitable for a system in which the second organic polymeric layer is peeled apart at image areas, and the latter case is suitable for a system in which peeling occurs between the first organic polymeric substance layer and the second organic polymeric substance layer. In a case in which a peelable layer is not provided, in order to increase the adhesion force between the permanent support and the transferable image, $P_5$, an adhesive layer as described in the above-cited patents may be provided on the surface of the permanent support.

The most preferable combinations of the first organic polymeric layer and the second organic polymeric layer are illustrated below:

Peeling force was measured, for example, by the process comprising preparing Samples for measuring peel force by laminating a 25 μm thick polyethylene terephthalate film on the surface to be measured at 25° C., using Fuji Laminator D-13 (made by Fuji Photo Film Co., Ltd) and measuring 180° peel force of the Sample between the surface of the polyethylene terephthalate film and the surface to be measured, while keeping the surface to be measured flat using a Tensilon UTM-II-20 tensile strength tester (made by Toyo Bordwin Co., Ltd.) (peeling speed: 40 mm/min; width of peeled sample: 50 mm).

The present invention is described below in greater detail with reference to the following examples.

EXAMPLE 1

A transferable image was produced according to the following steps.

In the first place, as a coating liquid for preparation of a peeling layer, a solution having the following composition was prepared.

Coating Liquid for Peelable Layer

| | |
|---|---|
| Alcohol-soluble polyamide (CM-8000, ($\eta$) at 20° C. of 10 wt % methanol solution: 23 cps, produced by Toray Co., Ltd.) | 7.2 g |
| Polyhydroxystyrene (Resin M, average molecular weight: 5,500, produced by Maruzen Oil Co., Ltd.) | 1.8 g |
| Methanol | 400 g |
| Methyl Cellosolve | 100 g |

This coating liquid was uniformly coated on a polyethylene terephthalate film (support, thickness: 100 μm) and then dried to form a peelable layer having a dry film thickness of 0.5 μm.

For the purpose of forming an image of N-P type (negative to positive) as coating liquids for formation of a light-sensitive resin layer, four light-sensitive solutions of yellow (Y), magenta (M), cyan (C) and black (B), each having a formulation as shown in Table 1, were prepared.

| | First Layer | Second Layer | | |
|---|---|---|---|---|
| 1 | Ethylene vinylacetate copolymer | Polyvinylbutyral or Gelatin | or | Alcohol-soluble polyamide |
| 2 | Ethylene ethylacrylate copolymer | Polyvinylbutyral or Gelatin | or | Alcohol-soluble polyamide |
| 3 | Vinylchloride vinylacetate copolymer | Polyvinylbutyral or Gelatin | or | Alcohol-soluble polyamide |
| 4 | Styrene hexylacrylate copolymer | Polyvinylbutyral or Gelatin | or | Alcohol-soluble polyamide |
| 5 | Rubber chloride | Polyvinylbutyral or Gelatin | or | Alcohol-soluble polyamide |
| 6 | Polypropylene | Polyvinylbutyral or Gelatin | or | Alcohol-soluble polyamide |
| 7 | Alcohol-soluble polyamide | Polyvinylbutyral or Gelatin | or | Alcohol-soluble polyamide |
| 8 | Styrene butadiene copolymer | Polyvinylbutyral or Gelatin | or | Alcohol-soluble polyamide |

TABLE 1

|  | Y | M | C | B |
|---|---|---|---|---|
| Benzyl methacrylate-methacrylic acid copolymer (molar ratio: 73/27, viscosity [η]: 0.12) | 60 g | 60 g | 60 g | 60 g |
| Pentaerythritol tetraacrylate | 43.2 g | 43.2 g | 43.2 g | 43.2 g |
| Michller's ketone | 2.4 g | 2.4 g | 2.4 g | 2.4 g |
| 2-(o-Chlorophenyl)-4,5-diphenylimidazole dimer | 2.5 g | 2.5 g | 2.5 g | 2.5 g |
| Seika Fast Yellow II-0755 (produced by Dainichi Seika Kogyo Co., Ltd.) | 9.4 g | — | — | — |
| Seika Fast Carmine 1483 (produced by Dainichi Seika Kogyo Co., Ltd.) | — | 5.2 g | — | — |
| Cyanine Blue 4820 (produced by Dainichi Seika Kogyo Co., Ltd. | — | — | 5.6 g | — |
| Mitsubishi Carbon Black KA-100 (produced by Mitsubishi Kasei Kogyo Co., Ltd.) | — | — | — | 6.6 g |
| Methylcellosolve acetate | 560 g | 560 g | 560 g | 560 g |
| Methyl ethyl ketone | 280 g | 280 g | 280 g | 280 g |

Note:
The viscosity [η] means the intrinsic viscosity in a methyl ethyl ketone solution at 250° C.

On four supports with peeling layer provided thereon was coated each of the four light-sensitive solutions, which was then dried to form a 2.4 μm thick light-sensitive resin layer.

Separately a coating liquid for preparation of a protective layer, having a composition as shown below was coated on the light-sensitive resin layer of each color to provide a protective layer having a dry film thickness of 1.5 μm.

Coating Liquid for Protective Layer

| Polyvinyl alcohol (G1-05, produced by Nippon Gosei Kagaku Co., Ltd.) | 60 g |
|---|---|
| Water | 970 g |
| Methanol | 30 g |

In this way, a four color light-sensitive transfer sheet (negative coloring light-sensitive sheet) comprising a support, a peelable layer on the support, a light-sensitive resin layer on the peelable layer, and a protective layer on the light-sensitive resin layer was prepared.

Each light-sensitive transfer sheet was superposed on the corresponding mask by the use of a resistor pin and then exposed imagewise by the use of 2 KW ultra high pressure mercury lamp at a distance of 50 cm. The exposed transfer sheet was developed at 35° C. for from 10 to 20 seconds using a developer having a formulation as set forth below. In this way, a four colored color proofing sheet having a dot image on the peeling layer was obtained.

Developer

| $Na_2Co_3$ | 15 g |
|---|---|
| Butylcellosolve | 1 g |
| Water | 1 liter |

An image-receiving sheet was prepared as follows.

A polyethylene terephthalate film (thickness: 100 μm) was coated with Coating Liquids A and B having the formulations shown below in this order to prepare a two-layer image-receiving sheet having the layers of A and B having dry film thicknesses of 20 μm and 1.5 μm, respectively.

Coating Liquid A

| Ethylene-vinyl acetate copolymer (ethylene/vinyl acetate = 81/19 by weight, Evaflex #410, | 15 g |
|---|---|

-continued

| produced by Mitsui Polychemical Co., Ltd.) | |
|---|---|
| Chlorinated polyethylene (Superchlone 907 LTA, produced by Sanyo Kokusaku Pulp Co., Ltd.) | 0.075 g |
| Fluorine-based surface active agent (Fluorad FC-430, produced by 3M Corp.) | 0.25 g |
| Toluene | 100 ml |

Coating Liquid B

| Polyvinyl butyral (#2000-L, produced by Denki Kagaku Kogyo Co., Ltd.) | 4 g |
|---|---|
| Fluorine-based surface active agent (Fluorad FC-430, produced by 3M Corp.) | 0.05 g |
| Methanol | 50 ml |
| Methyl ethyl ketone | 20 ml |
| Methyl cellosolve acetate | 20 ml |

In the first place, the black color proofing sheet was accurately placed on the image-receiving sheet by the use of a resistor pin in such a manner that the image side of the sheet was in contact with the image-receiving layer of the image-receiving sheet and then laminated by the use of a laminator (Fast Laminator B-550-80, produced by Taisei Shoji Co., Ltd.) under conditions of pressure 2 bar, roller temperature 120° C. and laminator speed 900 mm/min. Only the support of the color proofing sheet was peeled apart from the peeling layer to transfer a black image onto the image-receiving sheet. Subsequently the other three color proofing sheets were processed in the same manner as above to produce an image-receiving sheet in which dot images were transferred in the order of black, cyan, magenta, and yellow.

Then, using the image-receiving sheet having the above four colored transferred image, a color test sheet of the surprint system was prepared as follows.

The image-receiving sheet having the four colored transferred image was superposed on a white art paper in such a manner that the image-receiving layer came into contact with the paper and then laminated under the same conditions as above.

Then the image-receiving sheet and the white art paper were separated from each other. On the white art paper which was peeled apart between the second layer and the image area, the peeling layer, and the image area remained. In this way, without further matting of the surface, an image very similar to the printed matter was obtained.

EXAMPLE 2

The four colored light-sensitive transfer sheet as prepared in Example 1 was exposed in the same manner as in Example 1, and then developed with a developer having the formulation shown below while at the same time the peelable layer at non-image areas was etched. That is, dot image areas formed on the light-sensitive transfer sheet was composed of the peelable layer and the photopolymerized photopolymerizable layer. In non-image areas, an image was formed in the condition that the surface of the polyethylene terephthalate film was exposed.

Developer

| | | |
|---|---|---|
| Caustic soda | 0.3 g | |
| Surface active agent | 5 g | |
| (Perex NBL produced by | | |
| Kao Atlas Co., Ltd.) | | |
| Water | 100 ml | |

An image-receiving material was prepared as follows.

Coating liquids A and B having the compositions shown below were coated on a polyethylene terephthalate film (thickness: 100 μm) in this order in dry film thicknesses of 20 μm and 1,0 μm, respectively, to prepare a two layer structure image-receiving sheet.

Coating Liquid A

| | |
|---|---|
| Ethylene-vinyl acetate copolymer | 15 g |
| (ethylene/vinyl acetate = 91/19 by weight, Evaflex #410, produced by Mitsui Polychemical Co., Ltd.) | |
| Chlorinated polyethylene | 0.075 g |
| (Superchlone 907 LTS, produced by Sanyo Kokusaku Pulp Co., Ltd.) | |
| Fluorine-based surface active agent | 0.25 g |
| (Fluorad FC-430, produced by 3M Corp.) | |
| Toluene | 100 ml |

Coating Liquid B

| | |
|---|---|
| Polyvinyl butyral | |
| (#2000-L produced by Denki Kagaku Kogyo Co., Ltd.) | |
| Fluorine-based surface active agent | 0.15 g |
| (Fluorad FC-430 produced by 3M Corp.) | |
| Methanol | 50 ml |
| Methyl ethyl ketone | 20 ml |
| Methylcellosolve acetate | 20 ml |

Following the procedure of Example 1, an image was transferred to the image-receiving sheet, and then the image was transferred to a white art paper and the image-receiving sheet was peeled apart, whereupon peeling occurred between the first and second layers. Without application of surface matting treatment, the above-obtained image had good similarity to the printed matter as in Example 1.

EXAMPLE 3

An image-receiving sheet was produced in the same manner as in Example 1 except that Coating Liquids A and B having the compositions shown below were used in place of the Coating Liquids A and B.

Coating Liquid A

| | |
|---|---|
| Vinyl chloride-vinyl acetate copolymer | 15 g |
| (vinyl chloride/vinyl acetate = 60/40 by weight, degree of polymerization: 300) | |
| Fluorine-based surface active agent | 0.25 g |
| (Fluorad FC-430 produced by 3M Corp.) | |
| Dibutyl phthalate | 3 g |
| Methyl ethyl ketone | 100 ml |

Coating Liquid B

| | |
|---|---|
| Polyvinyl butyral | 4 g |
| (#2000-L produced by Denki Kagaku Kogyo Co., Ltd.) | |
| Fluorine-based surface active agent | 0.05 g |
| (Fluorad FC-430 produced by 3M Corp.) | |
| Methanol | 60 ml |
| Methylcellosolve | 40 ml |

Following the procedure of Example 1, an image was transferred to the image-receiving sheet, and then the image was transferred to a white art paper and the image-receiving sheet was peeled apart, whereupon peeling occurred between the interface between the second layer of the image-receiving sheet and the transferrable image. The image transferred to the white art paper was good as in Example 1.

EXAMPLE 4

An image-receiving sheet as described below was used. An image was transferred to the image-receiving sheet and further transferred to a white art paper. On peeling apart the image-receiving sheet, peeling occurred between the first and second layers of the image-receiving sheet. The image thus transferred to the white art paper was very similar to the printed matter without application of matting.

Preparation of Image-Receiving Material

Coating liquids A, B, and C as defined below were coated on a polyethylene terephthalate film (thickness: 100 μm), in the order listed, in dry film thicknesses of 0.2 μm, 10 μm and 1.5 μm, respectively, to prepare an image-receiving sheet.

Coating Liquid A (subbing treatment to increase the close contact force between the support and the above first layer)

| | |
|---|---|
| Chlorinated polyethylene | 2 g |
| (Superchlone 907 LTA produced by Sanyo Kokusaku Pulp Co., Ltd.) | |
| Silicone Adhesion Promoting agent | 0.5 g |
| (SH-6020 produced by Toray Silicone Co., Ltd.) | |
| Toluene | 100 ml |

Coating Liquid B

| | |
|---|---|
| Ethylene-vinyl acetate copolymer (ethylene/vinyl acetate = 81/19 by weight, Evaflex #410 produced by Mitsui Polychemical Co., Ltd.) | 10 g |
| Toluene | 40 ml |
| Cyclohexane | 60 ml |

Coating Liquid C

| | |
|---|---|
| Alcohol-soluble polyamide (Amilan CM-4000 produced by Toray Co., Ltd.) | 4 g |
| Fluorine-based surface active agent (Fluorad FC-430 produced by 3M Corp.) | 0.05 g |
| Methanol | 70 ml |
| Methylcellosolve | 30 ml |

EXAMPLE 5

In Example 2, as a solution for preparation of a light-sensitive layer, a solution having the composition as shown below was coated in a dry film thickness of 2.4 μm to prepare a light-sensitive transfer sheet of the positive-positive type.

TABLE 2

| | Yellow | Magenta | Cyan | Black |
|---|---|---|---|---|
| Acetone-pyrrogallol condensate (average degree of polymerization: 3) 2-diazo-1-naphthol-4-sulphenyl chloride adduct | 1.02 g | 0.61 g | 0.87 g | 1.26 g |
| Novolak-type phenol-formaldehyde resin (PR-50716 produced by Sumitomo Durez Co., Ltd.) | 2.87 g | 1.72 g | 2.44 g | 3.52 g |
| Abietic acid | 1.23 g | 1.73 g | 1.05 g | 1.52 g |
| Cathilon Brilliant Yellow 5GL | 1.064 g | 0.096 g | — | 1.2 g |
| Rhodamine 6GCP | — | — | — | 0.54 g |
| Rhodamine B | — | 0.102 g | — | — |
| Safranine OK70:100 | — | 0.384 g | 0.012 g | — |
| Victoria Pure Blue | — | — | 0.57 g | 0.40 g |
| Eriogalaucine X | — | — | 0.618 g | — |
| Tricresyl phosphate | 0.51 g | 0.31 g | 0.44 g | 0.64 g |
| Fluorine-based surface active agent (FC-430 produced by 3M Corp.) | 0.04 g | 0.04 g | 0.04 g | 0.04 g |
| Methyl ethyl ketone | 19.0 g | 19.5 g | 17.0 g | 18.0 g |
| Methylcellosolve acetate | 44 g | 43.5 g | 42.5 g | 43.5 g |
| Methylcellosolve | 44 g | 43.5 g | 42.5 g | 43.5 g |

By exposing and developing in the same manner as in Example 2, a transferable image was formed and further transferred in the same manner as in Example 2. On peeling apart the image-receiving sheet from the white art paper, peeling occurred between the first and second layers of the image-receiving sheet. The image transferred to the white art paper was as good as in Example 2.

While the invention has been described in detail and with reference to specific embodiments thereof, it will be apparent to one skilled in the art that various changes and modifications can be made therein without departing from the spirit and scope thereof.

What is claimed is:

1. A method for forming an image by transferring an image layer formed on a transferable light-sensitive material to an image-receiving sheet, and then further transferring the image to a permanent support, wherein the image-receiving sheet comprises a support, a first layer on the support, said first layer being made of a first organic polymeric substance, and a second layer on the first layer, said second layer being made of a second organic polymeric substance, wherein in peeling apart the image-receiving sheet from the transferable light-sensitive material, $$P_1, P_2, P_3 > P_4$$

wherein $P_1$ is an adhesion force between the support and the first layer, $P_2$ is an adhesion force between the first and second layers, $P_3$ is an adhesion force between the second layer and the transferable image layer, and $P_4$ is an adhesion force between the image layer and the support of the image, in re-transferring the image layer to the permanent support and peeling apart the image-receiving sheet from the permanent support, $$P_5, P_1, P_2 > P_3, \text{ or}$$

$$P_5, P_1, P_3 > P_2$$

wherein $P_5$ is in adhesion force between the permanent support and the transferable image layer, and the first layer has a softening point of 80° C. or less and the second layer has a softening point higher than the softening point of the first layer by 10° C. or more.

2. A method for forming an image as in claim 1, wherein the first layer contains at least one compound selected from the group consisting of a polyolefin, ethylene copolymer, polyvinyl chloride, vinylchloride copolymer, polyvinylidene chloride, vinylidene chloride copolymer, polystyrene, styrene copolymer, polyvinyl toluene, vinyl-toluene copolymer, polyacrylate or polymethacrylate, acrylate or methacrylate copolymer, vinyl acetate copolymer, polyamide resin, synthetic rubber, and chlorinated rubber.

3. A method for forming an image as in claim 1, wherein the first layer contains at least one compound selected from the group consisting of polyethylene; polypropylene; ethylene-ethylacrylate copolymer; ethylene-acrylate copolymer; polyvinyl chloride; polyvinylidene chlroide; vinylidene chloride copolymer; polystyrene; styrene-acrylate, methacrylate or hexylacrylate copolymer; styrene-butadiene copolymer; polyvinyl toluene; vinyltolueneacrylate or methacrylate copolymer; polyacrylate or polymethacrylate; vinyl acetate copolymer; nylon; nylon copolymer; alcohol-soluble polyamide; N-alkoxymethylated nylon; synthetic rubber; and chlorinated rubber.

4. A method for forming an image as in claim 1, wherein the second layer contains at least one compound selected from the group consisting of polyolefin; ethylene copolymer; polyvinyl chloride; vinyl chloride copolymer; polyvinylidene chloride; vinylidene chloride copolymer; polystyrene; styrene copolymer; polyacrylate; acrylate copolymer; polymethacrylate; methacrylic acid copolymer; vinyl acetate copolymer; butyral resin; gelatin; modified polyvinyl alcohol; polyamide resin; synthetic rubber; chlorinated rubber; and cellulose derivative.

5. A method for forming an image as in claim 1, wherein the second layer contains at least one compound selected from the group consisting of polyethylene; polypropylene; ethylene-acrylate copolymer; ethylene-acrylic acid copolymer; polyvinyl chloride; polyvinylidene chloride; vinylidene chloride copolymer; polystyrene; styrene-maleate copolymer; polyacrylate; polymethacrylate; acrylate-vinyl acetate copolymer; vinyl acetate copolymer; butyral resin; gelatin; polyvinyl butyral; nylon; alcohol-soluble polyamide; copolymer nylon; synthetic rubber; chlorinated rubber; and cellulose derivative.

6. A method for forming an image as in claim 1, wherein the first layer has a thickness of from 1 to 50 $\mu$m, and the second layer has a thickness of from 0.1 to 10 $\mu$m.

7. A method for forming an image as in claim 1, wherein the first layer has a thickness of from 5 to 50 $\mu$m, and the second layer has a thickness of from 0.5 to 3 $\mu$m.

8. A method for forming an image as in claim 1, wherein the softening point of the first layer is not less than $-100°$ C.

9. A method for forming an image as in claim 1, wherein the softening point of the second layer is not more than 150° C.

* * * * *